United States Patent
Srivastava et al.

(10) Patent No.: US 8,111,088 B2
(45) Date of Patent: Feb. 7, 2012

(54) LEVEL SHIFTER WITH BALANCED DUTY CYCLE

(75) Inventors: Ankit Srivastava, San Diego, CA (US); Xiaohong Quan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 12/767,370

(22) Filed: Apr. 26, 2010

(65) Prior Publication Data

US 2011/0260753 A1 Oct. 27, 2011

(51) Int. Cl.
*H03K 19/0175* (2006.01)
*H03K 19/094* (2006.01)

(52) U.S. Cl. ............... 326/68; 326/82; 326/83
(58) Field of Classification Search ............ 326/62–83; 327/333
See application file for complete search history.

(56) References Cited

U.S. PATENT DOCUMENTS

| | | | | |
|---|---|---|---|---|
| 4,412,143 A * | 10/1983 | Patella et al. | | 327/55 |
| 6,388,503 B1 * | 5/2002 | Maloney | | 327/384 |
| 6,667,648 B2 * | 12/2003 | Stout et al. | | 327/333 |
| 7,030,651 B2 * | 4/2006 | Madurawe | | 326/41 |
| 7,088,146 B1 * | 8/2006 | Megaw | | 327/67 |
| 7,245,156 B2 * | 7/2007 | Yeung et al. | | 326/86 |
| 7,248,066 B2 * | 7/2007 | Saraswat et al. | | 324/750.3 |
| 7,417,462 B1 * | 8/2008 | Wong et al. | | 326/82 |
| 7,460,387 B2 * | 12/2008 | Matick et al. | | 365/63 |
| 7,512,030 B2 * | 3/2009 | Houston et al. | | 365/226 |
| 2002/0114365 A1 * | 8/2002 | Gilliland et al. | | 372/38.02 |

FOREIGN PATENT DOCUMENTS

| | | |
|---|---|---|
| JP | 11017520 A | 1/1999 |
| JP | 11177409 A | 7/1999 |

OTHER PUBLICATIONS

International Search Report and Written Opinion—PCT/US2011/032898—ISA/EPO—Aug. 2, 2011.

* cited by examiner

*Primary Examiner* — Shawki S Ismail
*Assistant Examiner* — Crystal L Hammond
(74) *Attorney, Agent, or Firm* — Sam Talpalatsky; Nicholas J. Pauley; Jonathan T. Velasco (57) ABSTRACT

A level shifter and method are provided for balancing a duty cycle of a signal. An input circuit receives a differential logic signal with two complimentary logic levels. A level transition balancing circuit balances the rise and fall times of a level shifted version of each complimentary logic level during a transition from a first to a second of the logic levels and a level shift. A logic element stores and provides outputs of the level shifted versions of the logic levels. The level transition balancing circuit can include a capacitor in parallel with a transfer element for each input. The capacitor destabilizes inputs to the logic element and balances the transition using a capacitance and a level previously stored in the logic element.

28 Claims, 7 Drawing Sheets

LEVEL SHIFTER WITH BALANCED DUTY CYCLE

FIELD OF DISCLOSURE

The present disclosure is related to high speed receivers and related circuits, and more specifically, to a latch-based level shifter with balanced rise and fall times

BACKGROUND

Digital circuits commonly use a consistent logic level for internal signals. However, the logic level can vary from system to system and even within various subsystem circuits within the same system. A level shifter can be used to connect a digital circuit using one logic level to a digital circuit using another logic level. Multiple level shifters can be used, such as one in each system, where bidirectional shifting is required. A driver, for example, can convert from internal logic levels to levels that are compatible with standard interface line levels. A line receiver, for example, can converts from interface levels to internal voltage levels. Examples of standard interface levels include the transistor to transistor logic (TTL) or complimentary metal oxide semiconductor (CMOS) logic levels commonly found within integrated circuits. Within a digital system, such as a digital communication system, internal voltage levels can be referred to as logic levels, while external voltage levels can be referred to as line levels.

Digital circuits generally operate based on the logic signals having logical transitions from one level to another level, for example, according to a specified time period for synchronous digital circuits. When a level shifter is required, it is often the case that the timing of the original signal transitions is distorted. For modern high-speed digital receivers and related phase locked loop (PLL) circuits stringent duty-cycle distortion requirements are present for level shifters since duty cycle or bit period distortion in a high speed digital receiver directly affects the jitter budget of CDR.

While simple level shifters are available in the prior art that accurately and adequately translate levels associated with an input logic signal, such circuits have disadvantages in that they can distort the time domain characteristic of the signal, such as the duty-cycle, due to unmatched rise/fall transitions that do not correspond precisely enough with the timing characteristics of the original signal to be suitable for high speed digital communication applications. Such lack of matching or correspondence can lead disadvantageously to jitter, data errors, and the like.

SUMMARY

Exemplary embodiments are directed to systems and method for balancing a transition in a level shifting circuit. An input circuit receives a differential logic signal from two input nodes associated with two complimentary logic levels. The two input nodes are coupled respectively to symmetric portions of the input circuit. The input circuit includes a level transition balancing circuit and a logic element coupled to the input circuit. The level transition balancing circuit balances the respective rise and fall times of level shifted versions of the two complimentary logic levels associated with the differential logic signal during a transition from a first to a second of the two complimentary logic levels and an associated level shift. The logic element stores and provides outputs of the level shifted versions of the two complimentary logic levels on two output nodes after the transition. The level transition balancing circuit includes a capacitor in parallel with a transfer element for each of the two input nodes. The capacitor balances the respective rise and fall times during the transition using a capacitance and a previous level shifted version of the complimentary logic level stored in the logic element. The transfer element includes a field effect transistor (FET). The logic element includes a latch that further holds the output levels of the level shifted versions of the two complimentary logic levels after the transition. The latch can be embodied as a pair of cross coupled inverters.

In accordance with various aspects, an exemplary latch can include a first field effect transistor (FET) of a first polarity coupled to a first FET of a second polarity between a ground potential and a source potential. The first FETs can have gates thereof coupled to each other and to a first of the two output nodes, and to a second field effect transistor (FET) of the first polarity coupled to a second FET of the second polarity between the ground potential and the source potential. The second FETs can have gates thereof coupled to each other and to a second of the two output nodes.

In accordance with an aspect, a circuit can be provided for balancing rise and fall times associated with a level transition in a level shifter. The circuit can include an input transfer element for each one of two input nodes associated respectively with one of two complementary logic levels of a differential logic signal, a latch coupled to the respective input transfer element, and a capacitor coupled in parallel with the input transfer element. The latch can hold level shifted versions of the two complimentary logic levels on two output nodes after the level transition from a first to a second of the two complimentary logic levels. The capacitor balances the respective rise and fall times of the level shifted versions of the two complimentary logic levels during the transition so as to eliminate a timing variance between the two complimentary logic levels and the level shifted versions on the two output nodes associated with the level transition. The capacitor further destabilizes the latch through capacitive coupling to differential inputs of the latch.

In accordance with an aspect, a level shifter can include input means, such as various arrangements of the input circuits described in greater detail hereinafter, for receiving two complimentary logic levels of a differential logic signal from two input nodes coupled respectively to symmetric portions of the input means. A level transition balancing means can be included for balancing the respective rise and fall times of level shifted versions of the two complimentary logic levels during a transition from a first to a second of the two complimentary logic levels and an associated level shift. Logic means, such as various arrangements of the latching circuits described in greater detail hereinafter, can be coupled to the input means and may further be provided for holding the two complimentary logic levels and outputting the two complimentary logic levels on two output nodes after the transition from the first to the second of the two complimentary logic levels. The level transition balancing means can include a capacitive means, such as various arrangements of a capacitor and related circuits as described in greater detail hereinafter, in parallel with a transfer element for each of the two input nodes. The capacitive means can be provided for balancing the rise times of the level shifted versions of the two complimentary logic levels during the transition using a capacitance and a previous level shifted version of the complimentary logic level stored in the logic means.

In accordance with an aspect, a method can be provided for level shifting. The method can include receiving a differential logic signal including two complimentary logic levels associated therewith, level shifting the differential logic signal to form level shifted versions of the two complimentary logic levels, and balancing the respective rise and fall times of the level shifted versions of the two complimentary logic levels during a transition from a first to a second of the two complimentary logic levels so as to eliminate a timing variance between the two complimentary logic levels and the level shifted versions thereof. The method can further include holding and outputting the level shifted versions of the two complimentary logic levels on two output nodes after a transition from a first to a second of the two complimentary logic levels.

BRIEF DESCRIPTION OF THE DRAWINGS

The accompanying drawings are presented to aid in the description of embodiments and are provided solely for illustration of the embodiments and not limitation thereof.

DETAILED DESCRIPTION

Aspects are disclosed in the following description and related drawings directed to specific embodiments. Alternate embodiments may be devised without departing from the scope of the invention. Additionally, well-known elements will not be described in detail or will be omitted so as not to obscure the relevant details.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

The terminology used herein is for the purpose of describing particular embodiments only and is not intended to be limiting of embodiments. As used herein, the singular forms "a", "an" and "the" are intended to include the plural forms as well, unless the context clearly indicates otherwise. It will be further understood that the terms "comprises", "comprising", ", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 1:
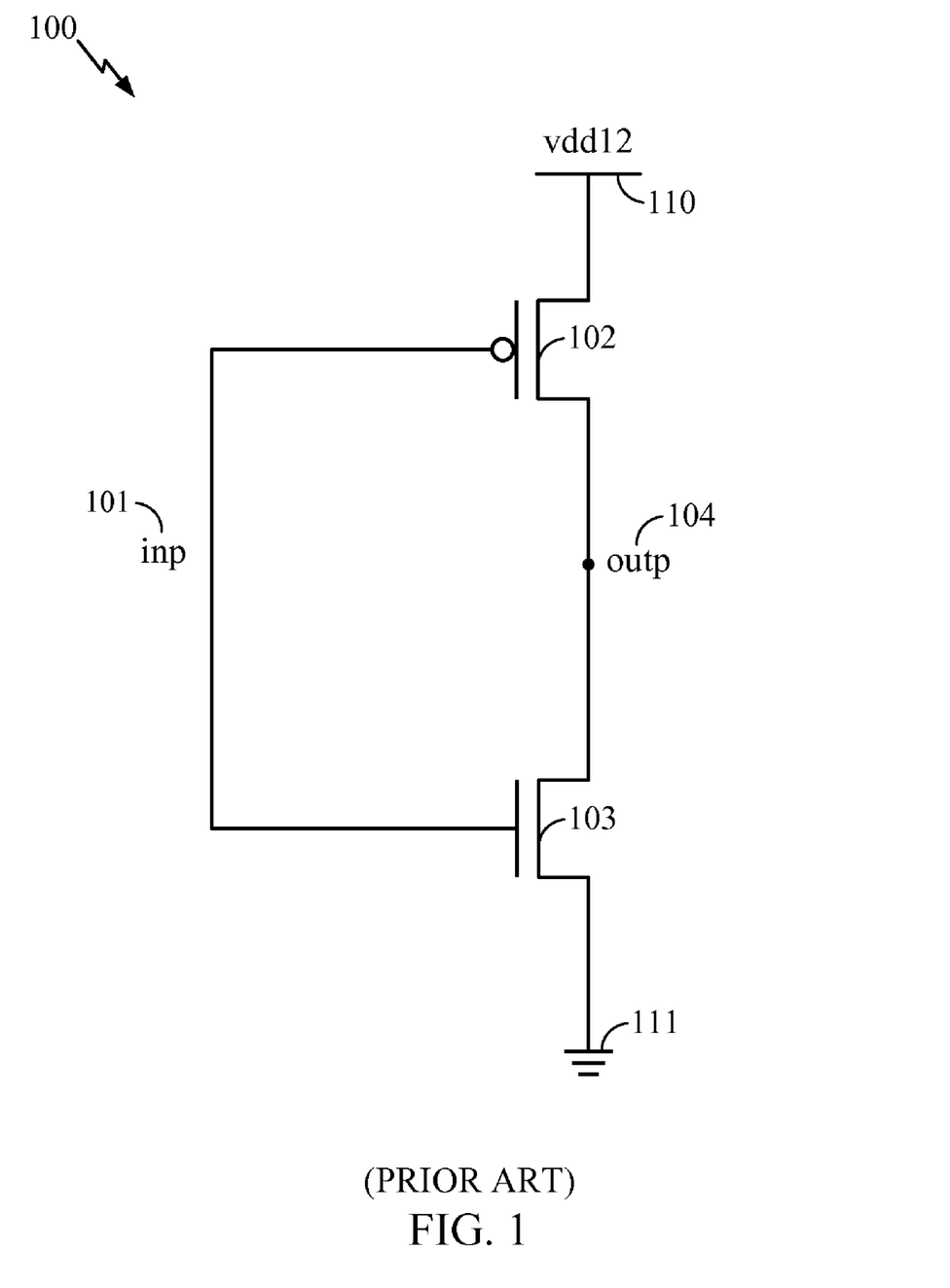
FIG. 1 is a circuit diagram illustrating an example of a common inverter-based level shifter.
Figure 2:
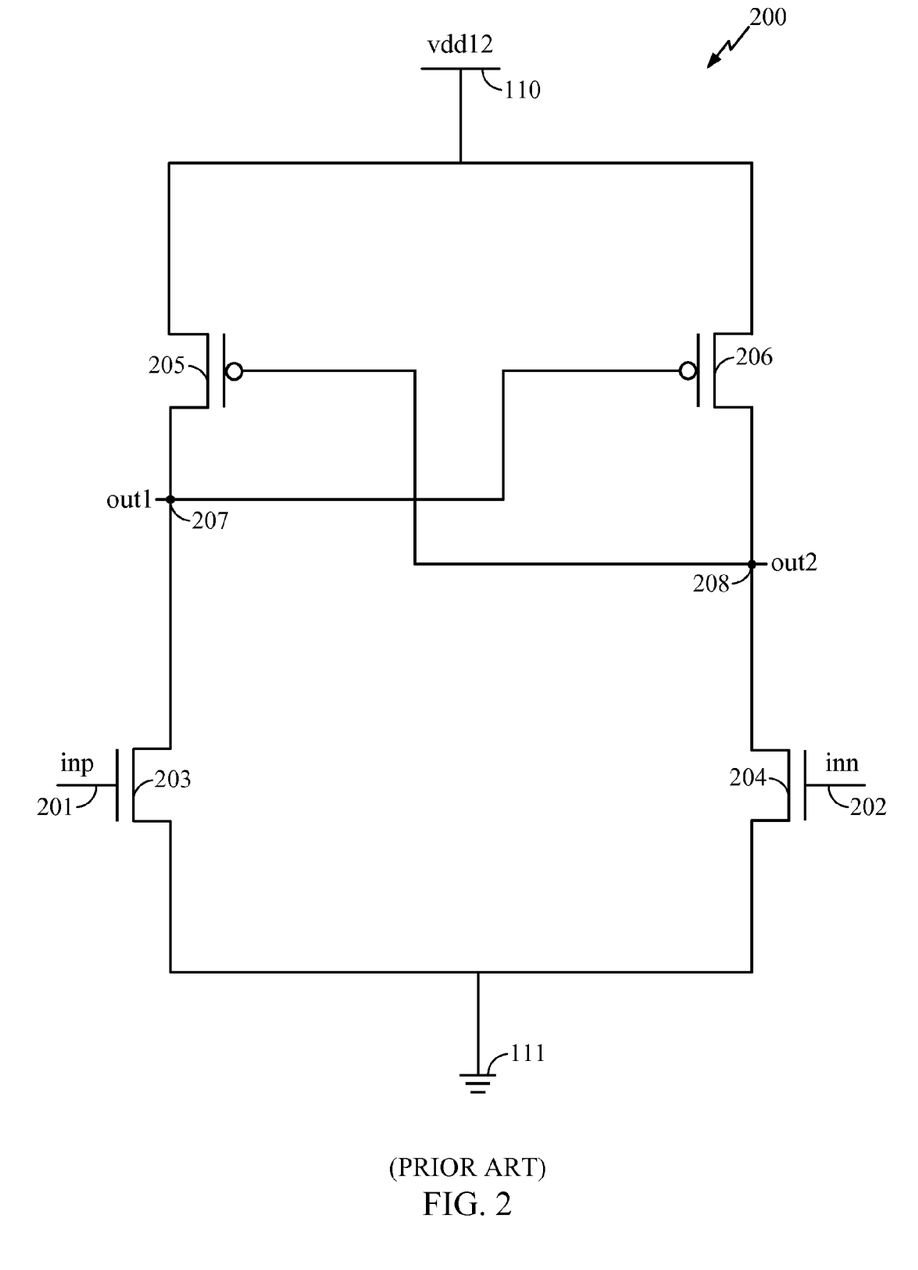
FIG. 2 is a circuit diagram illustrating another example of a common latched-based level shifter

Accordingly, with reference to the figures, FIG. 1 and FIG. 2 show conventional inverter circuit 100 and conventional latch circuit 200 respectively. It is known that an inverter such as the inverter circuit 100 can be used for level shifting. A signal input 101 can be input to the gates of elements 102 and 103, which are transfer elements such as field effect transistors (FETs) having opposite polarities and can be coupled between a voltage source such as Vdd12 110 and a reference voltage such as ground 111. A level shifted and inverted output can be obtained from, for example, the junction between elements 102 and 103, such as at output 104. Further, conventional level shifting can be accomplished with a latch circuit, such as latch circuit 200 shown in FIG. 2.

A differential input signal, that is a signal pair having complimentary, for example, opposite polarity, signals that represent complimentary versions of the same information, such as signals input positive (inp) 201 and input negative (inn) 202 can be input to elements 203 and 204 respectively of FIG. 2. The inputs can be a high voltage signal level and the shifter is for shifting the levels down, for example to the 1.2 volt logic domain. It should be noted that the latch circuit consists of negative metal oxide semiconductor (NMOS) elements and positive MOS (PMOS) element, each having different drive characteristics. Further, since the NMOS elements trigger during a high transition, there are different gate delays for high and low transitions and thus the rise and fall times are not symmetric or matched. When the input is positive, the corresponding one of elements 203 and 204 are turned on, coupling the corresponding one of output nodes 207 and 208 to ground 111 and biasing the corresponding one of opposite polarity elements 205 and 206 to an ON state, whereupon the other of the corresponding one of output nodes 207 and 208 is brought to the approximate level of source voltage 110. The other of the opposite polarity elements 205 and 206 is biased OFF thus "latching" the result on the output nodes 207 and 208.

As will be appreciated, particularly with reference to the rise time and fall time graphs shown in FIG. 5 and described in greater detail hereinafter, there are drawbacks to the use of conventional circuits shown in FIG. 1 and FIG. 2 for performing level shifting in high speed communications applications. For certain applications, such as high speed universal serial bus (USB) 2.0 receiver applications, a variations associated with rise fall mismatches, on the order of less than 40 ps is tolerated for high speed receiver operating, for example, at 450 MHz. In particular, due to the above described mismatches between PMOS and NMOS characteristics and the differences in drive characteristics and gate characteristics for turning on and turning off, timing variances can arise that, in high speed circuits, can cause distortion and anomalies such as jitter, inter-symbol interference (ISI), and the like, which, in turn, can lead to synchronization issues and data errors in clock data recovery (CDR). Such timing errors are generally due to the asymmetrical relation of the circuit elements to the input level transitions and the corresponding unbalanced propagation of the signal transitions through the prior art circuits. What is provided by various embodiments described herein is a relatively simple solution to eliminating the timing variances, balancing the signal transitions, and thus reducing the probability of synchronization and error issues.

Figure 3:
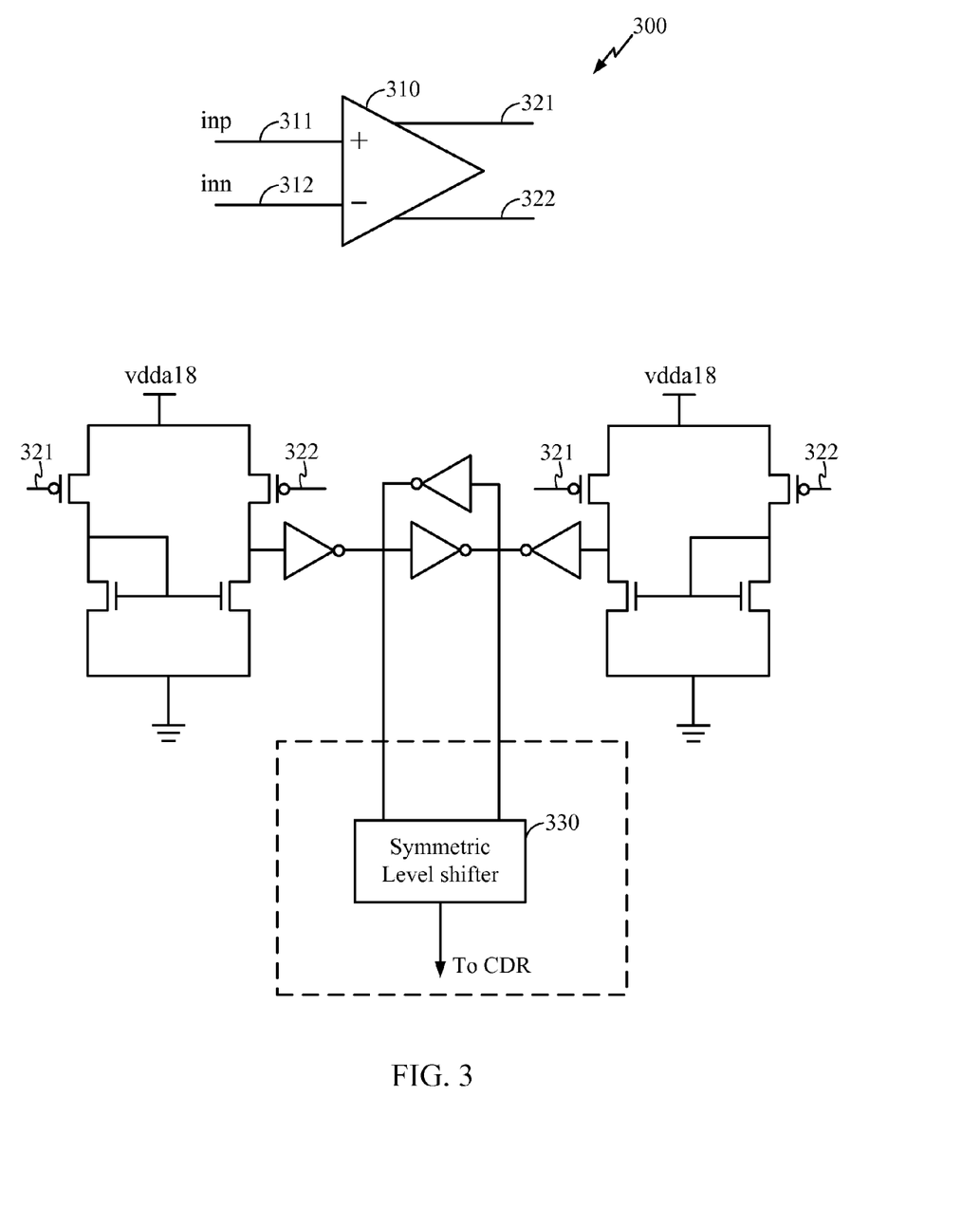
FIG. 3 is a block diagram illustrating an arrangement using of an exemplary level shifter block.

A block diagram of an exemplary system 300 can provide a better understanding of where balancing can be accomplished with reference to FIG. 3. A differential amplifier 310 can have inputs for positive and negative complimentary levels of a logic signal, shown as inp 311 and inn 312. The amplifier 310 can further have outputs 321 and 322 that can be input to various circuits, such as high input impedance transconductance amplifiers and the like to maintain current requirements and other requirements. Ultimately, the input signals are input to a symmetric level shifter 330 for providing level shifting from the line level to the appropriate internal logic level and for passing the signal to a timing sensitive circuit such as a clock and data recovery (CDR) circuit or the like.

Figure 4:
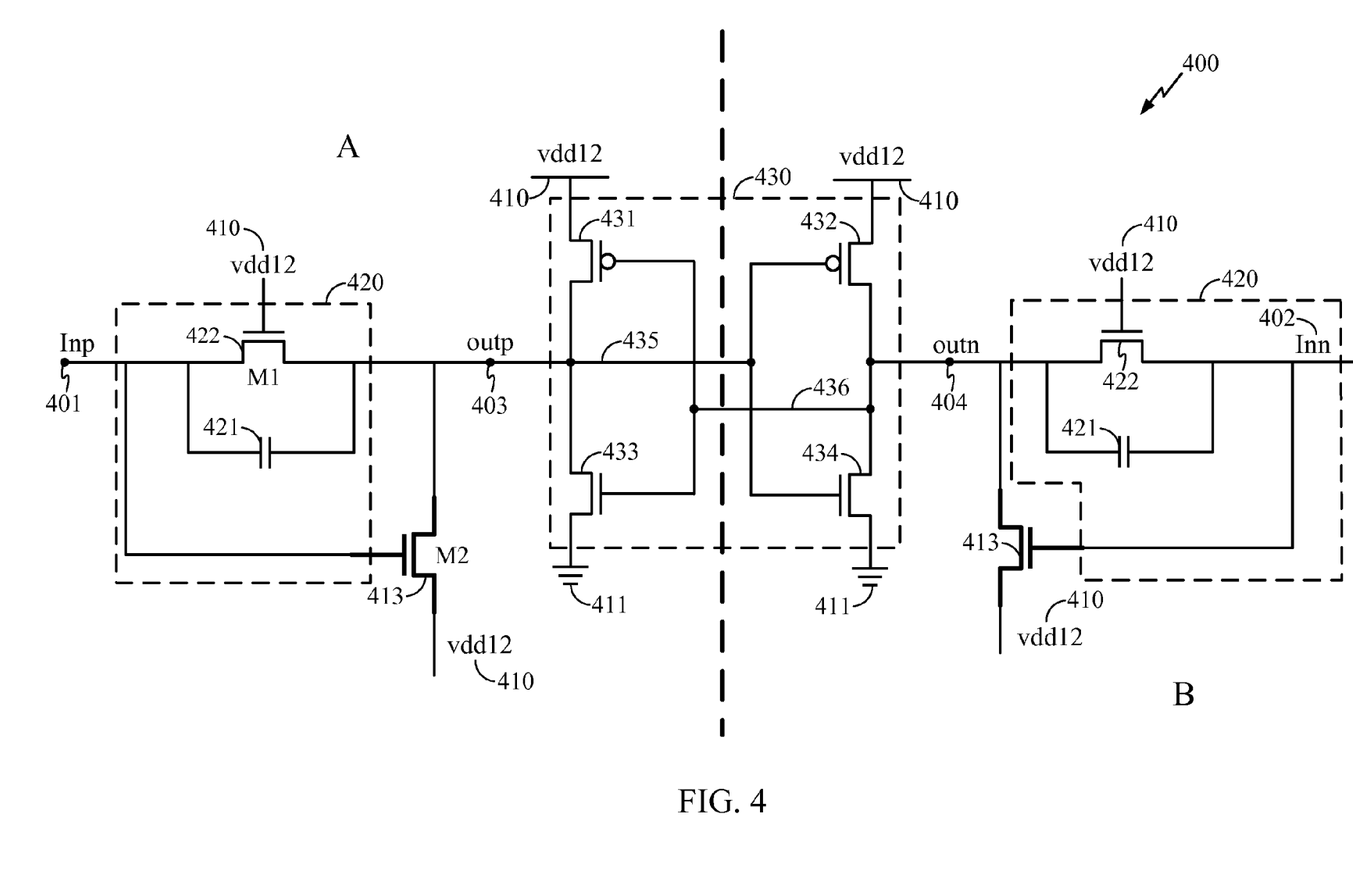
FIG. 4 is a circuit diagram illustrating an exemplary level shifter circuit.

An exemplary circuit 400, various embodiments and portions thereof, providing symmetric level shifting, symmetric level down shifting, balancing, and the like for an input logic signal, such as a differential signal constituted as a pair of signals corresponding to complimentary logic levels is shown in FIG. 4. Symmetric portions A and B can correspond to, for example, input portions for receiving respective ones of the complimentary logic levels associates with Inp 401 and Inn 402. It should be noted that in accordance with a level down shifting circuit, the input voltage levels can be greater than the internal circuit levels, which for illustrative purposes are shown, for example as 1.2 volts, or the like. The inputs 401 and 402 are also coupled respectively to gates of elements 410 in each of the portions A and B for controlling the provision of a level shifted output at output nodes 403 and 404. With reference to portion A as an example, when input inp 401 falls to a voltage level less than Vdd$12-V_T$, which is the voltage drop across element M1 422, M1 is turned on. M2 turns OFF when the level falls below vdd$12+V_T$. It should be noted that the purpose of elements M1 and M2 is to maintain the DC logic levels in the circuit. For example, if Inp 401 is low then M1 is ON and M2 is OFF to ensure that outp 403 is low and outn 404 is high. Similarly, if Inp 401 is high then M1 is OFF and M2 is ON to ensure that outp 403 is high and outn 404 is low. During differential switching at 401 and 402, the capacitor 421 by-passes the switch M1 and forces outp 403 to follow Inp 401 and outn 404 to follow Inn 402, which has the effect of destabilizing the latch and completing the transition.

Since capacitors 421 have a high degree of matching and provide a balancing action for the latch, the rise/fall times at node 403 and 404 are correspondingly balanced or matched. The output provided on output node 403 through element M1 422 of input portion 420 is configured, through the advantageous action of capacitor 421 and the previous latched level, to follow the input transition as nearly as possible. In other words, due to the simple placement of the capacitor 421 and the latching function of logic element 430, outp 403 follows Inp 401.

After the input and output levels are stabilized at a low level, capacitor 421 is effectively open. The gate of M1 422 is permanently coupled to a source voltage level Vdd12 410 having the effect of permanently biasing M1 422 such that any high level above vdd$12-V_T$ on the input will cause M1 to be placed into the OFF state. The negative voltage at output node 403 is coupled to the gates of elements 432 and 434 of logic element 430, which are coupled between vdd12 410 and ground 411. It should be noted that logic element 430 is shown in FIG. 4, for example, embodied as a latch. An exemplary latching means can be supported with such a circuit structure as illustrated and described herein and other equivalent structures as described herein, such as processors, programmed logic and the like, as would be appreciated by one of ordinary skill. The output node 403 is further coupled to the junction node 435 between elements 431 and 433. With reference now to portion B and the corresponding one of input portion 420, the negative level on the gates of elements 432 and 434, and the complimentary level of the input Inn 402 and action of element 422, described above, holds the output node 404 at a high level.

The advantages of various embodiments as described herein are apparent during a transition from one of the complimentary logic levels to another. Of particular interest in the present example is when, for example, the input Inp 401 transitions from a low level, for example a level greater than vdd$12-V_T$, to a high level and, correspondingly, the high input level at Inn 402 transitions from a high level to a low level. With reference to portion A as an example, when the low level at Inp 401 begins to rise, a charge forms across capacitor 421, acting as a transition balancing means or circuit. In effect, the charge across capacitor 421 acting together with the previously latched level, advantageously smoothes the transition of the level-shifted level on output node 403 from a low to a high level by allowing the level-shifted level to begin rising immediately in response to the change in the input signal at Inp 401. As the input level rises, for example, above vdd$12+V_T$, M2 turns on and the level at output node 403 rises, the biasing of elements 432 and 434 is reversed, driving the level at output node 404 to a low level. Correspondingly, by a similar action but in response to a complimentary input of opposite polarity in the input circuit 420 coupled to the input Inn 402, the biasing of the elements 431 and 433 is also reversed driving the output node 403 to a high level.

Figure 5A:
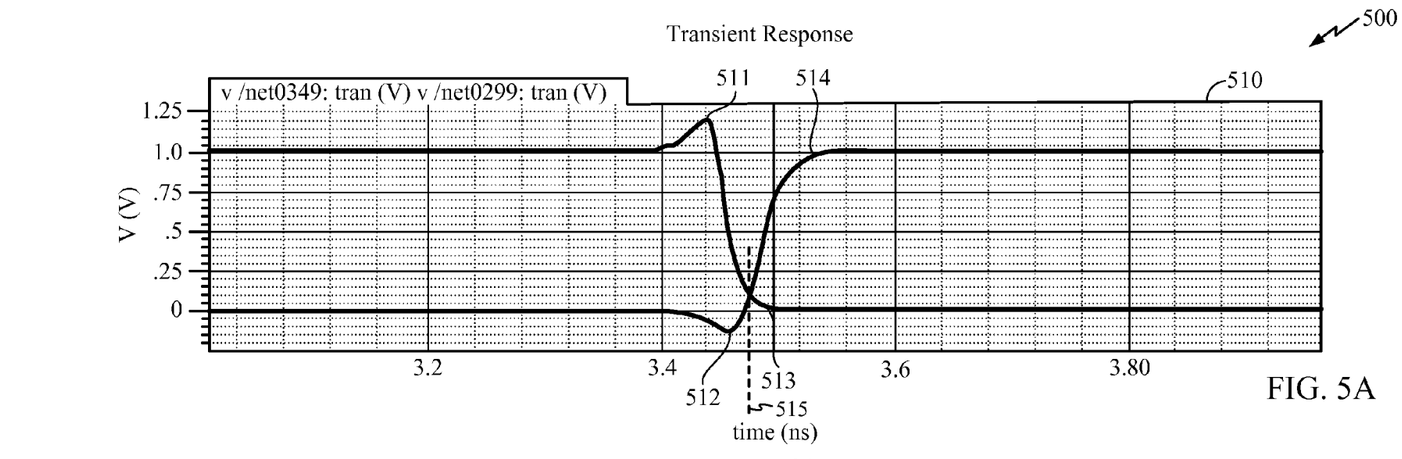
FIG. 5A is a graph illustrating performance characteristics consistent with the prior art level shifter of FIG. 1.
Figure 5B:
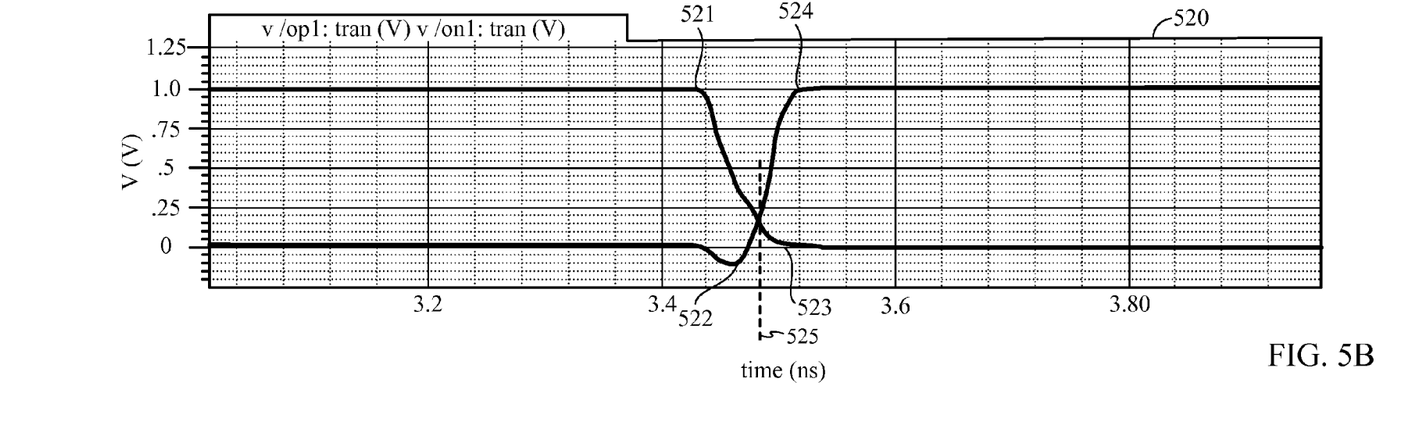
FIG. 5B is a graph illustrating performance characteristics consistent with the prior art level shifter FIG. 2.
Figure 5C:
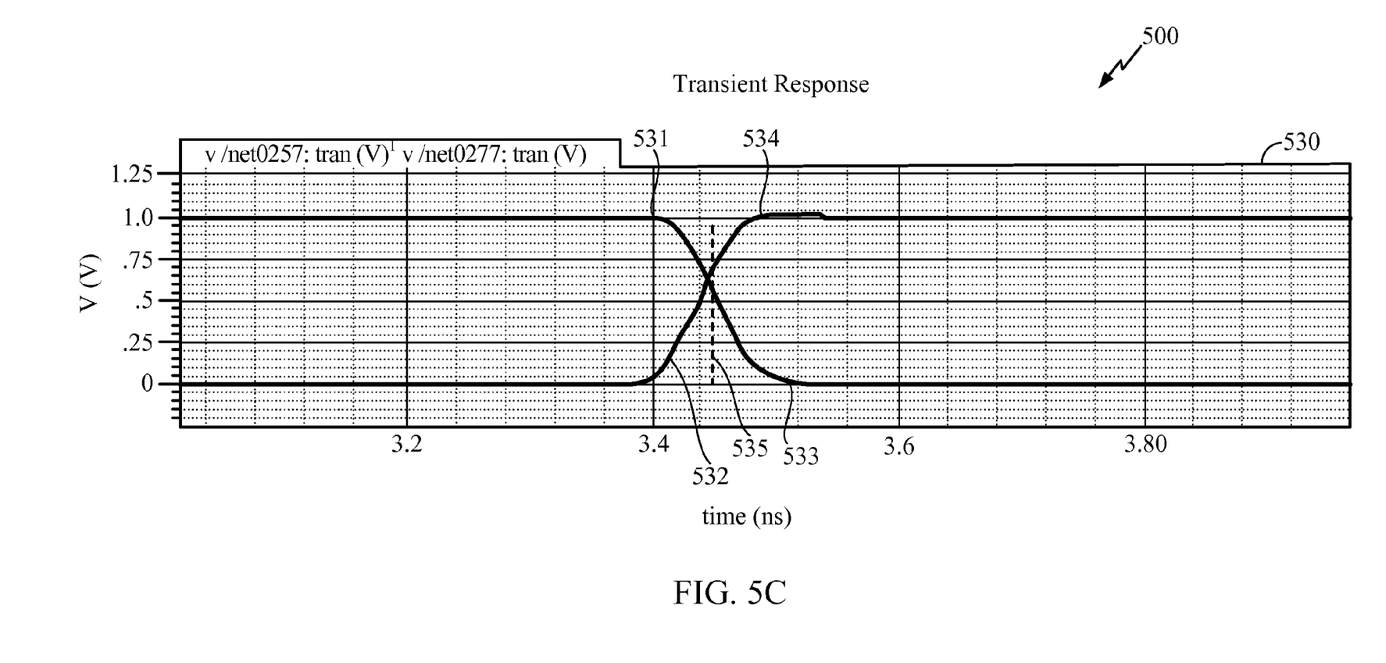
FIG. 5C is a graph illustrating performance characteristics consistent with the exemplary level shifter of FIG. 4.

In view of the above described transition balancing and by way of comparison, it can be seen from the graphs of FIG. 5A, FIG. 5B and FIG. 5C that acceptable transitions can be obtained from a simple combination of circuit elements. For example, with reference to FIG. 5A a transient response of the prior art inverter circuit of FIG. 1 is shown. After the level transition begins from high to low, an overshoot appears at 511 based on the characteristics of the circuit elements and the effect of the reversal acting between the two elements. It can be seen that due to differences in the action of the characteristics based on the polarity of the input signal it can be seen that for the complimentary signal transition from low to high, an overshoot appears at 512, but it is slightly delayed. While the transition smoothes as it approaches completion, it will be noted that the completion point for the high to low transition at 513 occurs earlier than the low to high transition completion point at 514. Further the balance point 515 is delayed around 250 ps, and is negatively biased, which for an exemplary high tolerance receiver circuit such as a USB 2.0 circuit having a variation tolerance of only 40 ps, would be unacceptable.

With reference to FIG. 5B, a transient response of the prior art latch circuit of FIG. 2 is shown. The latch circuit shows a slight improvement in the positive overshoot at 521, however negative overshoot is still present at 522. The completion points 524 and 523 are more closely balanced, however, the transition balance point is still significantly delayed for a tight tolerance application.

FIG. 5C shows the balanced transition associated with an exemplary transition balancing circuit as shown and described above in connection with FIG. 4. Both the high to low and low to high transition points 531 and 532 begin smoothly and at roughly the same instant. Since the rate of rise and fall are balanced, the transition balance point 535 occurs about mid voltage with little or no deviation from the specified rise and fall balance time of, for example, 360 ps. The transition completion points 533 and 534 are similarly smooth. With the exemplary balancing circuit as described herein in accordance with various embodiments, such as in a 45 nm process embodiment, a duty cycle variation can be reduced to around 0.5%. With 28 nm process embodiments further advantages are to be expected.

Figure 6:
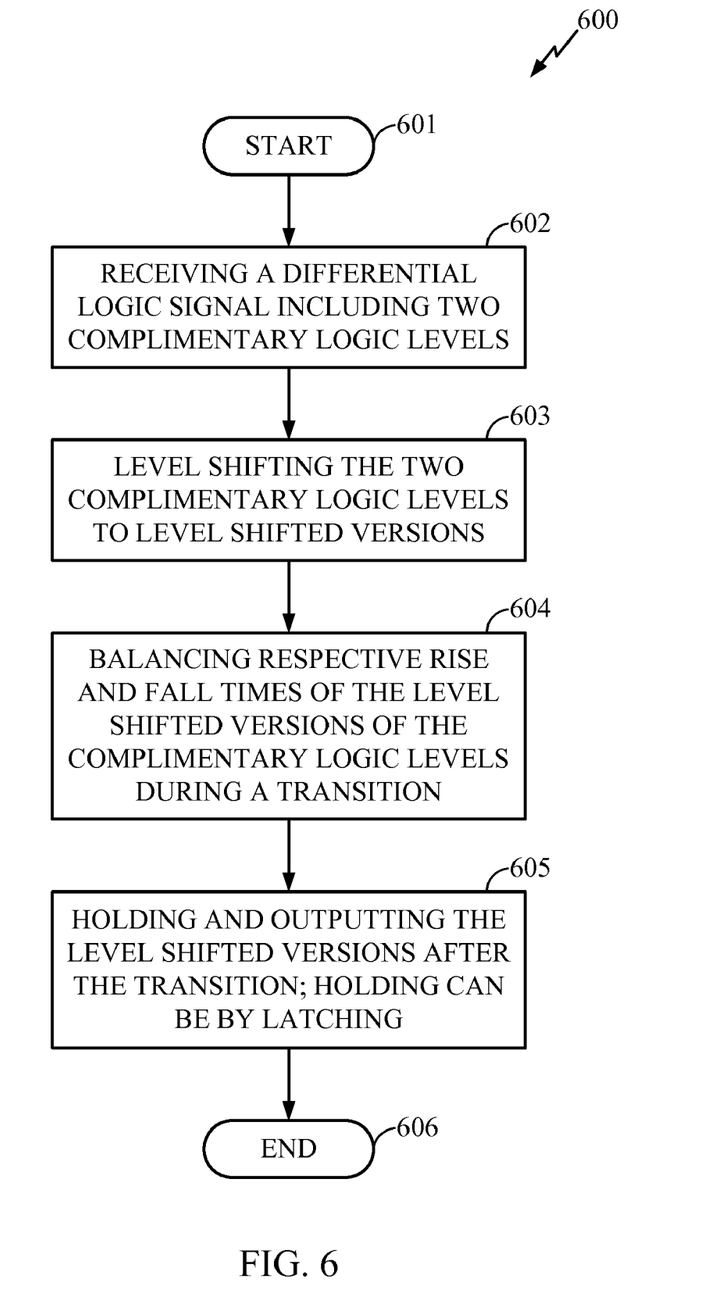
FIG. 6 is a flow chart illustrating an exemplary procedure for level shifting.

It will be appreciated that an embodiment can include an exemplary procedure or method 600, exemplary portions thereof which are illustrated in FIG. 6. After start at 601, a differential logic signal including two complimentary logic levels can be received at 602. It will be appreciated that in accordance with a level down shifting circuit, the logic signal levels may exceed the internal logic levels and are thus shifted down in level. Other configurations are possible where the levels are shifted up or the like. The two complimentary logic levels are shifted to level shifted levels, such as down shifted at 603. During the transition of the complimentary logic levels and the level shifted versions thereof, such as from high to low at one input and from low to high on the complimentary input, the corresponding rise and fall times can be balanced at 604, by operation of, for example, the transition balancing circuit, capacitor, and the like and making use of a previously stored level, as described herein above. After the transition, the level shifted versions of the complimentary logic levels are held, latched, or the like, and outputted at 605. Although the exemplary procedure is indicated as ending at 606, it will be appreciated that the procedure can be performed for every transition of the complimentary logic levels. While the procedure 600 is shown with various actions or sub-procedures, embodiments are not limited solely to those described herein. It will be appreciated that the exemplary procedure can be embodied as a series of steps and associated functions as set forth in the claims appended hereto using suitable structures and procedures, for example, as described herein.

It will be further appreciated that the level shifter as described herein may be included within a mobile phone, portable computer, hand-held personal communication system (PCS) unit, portable data units such as personal data assistants (PDAs), GPS enabled devices, navigation devices, settop boxes, music players, video players, entertainment units, fixed location data units such as meter reading equipment, or any other device that stores or retrieves data or computer instructions, or any combination thereof. Accordingly, embodiments of the disclosure may be suitably employed in any device which includes active integrated circuitry including the level shifter as disclosed herein such as by being integrated into at least one semiconductor die associated with circuits in such devices.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

To the extent applicable, the methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment can include a computer readable media embodying a method for balancing a transition of a level shifted signal. Accordingly, the invention is not limited to illustrated examples and any means for performing the functionality described herein are included in embodiments.

The foregoing disclosed devices and methods can be designed using computer aided design methods and systems and are configured into, for example, GDSII, GERBER, and similar computer files output from compute aided design systems, and stored on a computer readable media. These files are in turn provided to fabrication handlers who fabricate devices based on these files. The device designs can be replicated onto semiconductor wafers, for example, as stand alone circuits or as parts of other circuits, and can then be cut into semiconductor die and packaged into a semiconductor chip. The chips can then be employed in various devices.

While the foregoing disclosure shows illustrative embodiments, it should be noted that various changes and modifications could be made herein without departing from the scope of the invention as defined by the appended claims. The functions, steps and/or actions of the method claims in accordance with the embodiments described herein need not be performed in any particular order. Furthermore, although elements may be described or claimed in the singular, the plural is contemplated unless limitation to the singular is explicitly stated.

What is claimed is:

1. A level shifter comprising:
   an input circuit that receives a differential logic signal from two input nodes associated with two complementary logic levels, the two input nodes coupled respectively to symmetric portions of the input circuit, the input circuit including a level transition balancing circuit;
   a logic element coupled to the input circuit,
   wherein:
      the level transition balancing circuit balances the respective rise and fall times of level shifted versions of the two complementary logic levels associated with the differential logic signal during a transition from a first to a second of the two complementary logic levels and an associated level shift;
      the logic element stores and provides outputs of the level shifted versions of the two complementary logic levels on two output nodes after the transition;
      and wherein the level transition balancing circuit includes a capacitor in parallel with a transfer element for each of the two input nodes, the capacitor balancing the respective rise and fall times during the transition using a capacitance and a previous level shifted version of the complementary logic level stored in the logic element.

2. The level shifter according to claim 1, wherein the capacitor further destabilizes the differential logic signal on the two input nodes to the logic element.

3. The level shifter according to claim 1, wherein the transfer element includes a field effect transistor (FET).

4. The level shifter according to claim 1, wherein the logic element includes a latch that further holds the output levels of the level shifted versions of the two complementary logic levels after the transition.

5. The level shifter according to claim 4, wherein the latch includes a pair of cross coupled inverters.

6. The level shifter according to claim 4, wherein the latch includes a first field effect transistor (FET) of a first polarity coupled to a first FET of a second polarity between a ground potential and a source potential, the first FETs having gates thereof coupled to each other and to a first of the two output nodes, and a second field effect transistor (FET) of the first polarity coupled to a second FET of the second polarity between the ground potential and the source potential, the second FETs having gates thereof coupled to each other and to a second of the two output nodes.

7. The level shifter of claim 1 integrated in at least one semiconductor die.

8. The level shifter of claim 1, wherein the level shifter is integrated into an electronic device, selected from the group consisting of a set top box, music player, video player, entertainment unit, navigation device, communications device, personal digital assistant (PDA), fixed location data unit, and a computer.

9. A circuit for balancing rise and fall times associated with a level transition in a level shifter, the circuit comprising:
an input transfer element for each one of two input nodes associated respectively with one of two complementary logic levels of a differential logic signal;
a latch coupled to the respective input transfer element;
a capacitor coupled in parallel with the input transfer element, wherein:
the latch holds level shifted versions of the two complementary logic levels on two output nodes after the level transition from a first to a second of the two complementary logic levels; and
the capacitor balances the respective rise and fall times of the level shifted versions of the two complementary logic levels during the level transition so as to eliminate a timing variance between the two complementary logic levels and the level shifted versions on the two output nodes associated with the level transition.

10. The circuit according to claim 9, wherein the transfer element includes a field effect transistor (FET).

11. The circuit according to claim 9, wherein the latch includes a pair of cross coupled inverters.

12. The circuit according to claim 9, wherein the latch includes a first field effect transistor (FET) of a first polarity coupled to a first FET of a second polarity between a ground potential and a source potential, the first FETs having gates thereof coupled to each other and to a first of the two output nodes, and a second FET of the first polarity coupled to a second FET of the second polarity between the ground potential and the source potential, the second FETs having gates thereof coupled to each other and to a second of the two output nodes.

13. The circuit according to claim 9 integrated in at least one semiconductor die.

14. A level shifter comprising:
input means for receiving two complementary logic levels of a differential logic signal from two input nodes coupled respectively to symmetric portions of the input means;
level transition balancing means for balancing the respective rise and fall times of level shifted versions of the two complementary logic levels during a transition from a first to a second of the two complementary logic levels and an associated level shift; and
logic means coupled to the input means for holding the two complementary logic levels and outputting the two complementary logic levels on two output nodes after the transition from the first to the second of the two complementary logic levels;
wherein the level transition balancing means includes capacitive means in parallel with a transfer element for each of the two input nodes, the capacitive means for balancing the rise times of the level shifted versions of the two complementary logic levels during the transition using a capacitance and a previous level shifted version of the respective complementary logic level stored in the logic means.

15. The level shifter according to claim 14, wherein the transfer element includes a field effect transistor (FET).

16. The level shifter according to claim 14, wherein the logic means includes latching means for holding the output levels of the two complementary logic levels after the transition.

17. The level shifter according to claim 14, wherein the logic means includes a pair of cross coupled inverters.

18. The level shifter according to claim 16, wherein the latching means includes a first field effect transistor (FET) of a first polarity coupled to a first FET of a second polarity between a ground potential and a source potential, the first FETs having gates thereof coupled to each other and to a first of the two output nodes, and a second FET of the first polarity coupled to a second FET of the second polarity between the ground potential and the source potential, the second FETs having gates thereof coupled to each other and to a second of the two output nodes.

19. The level shifter according to claim 14 integrated in at least one semiconductor die.

20. The level shifter according to claim 14, wherein the level shifter is integrated into an electronic device, selected from the group consisting of a set top box, music player, video player, entertainment unit, navigation device, communications device, personal digital assistant (PDA), fixed location data unit, and a computer.

21. A method for level shifting comprising:
receiving a differential logic signal including two complementary logic levels associated therewith;
level shifting the differential logic signal to form level shifted versions of the two complementary logic levels; and
balancing the respective rise and fall times of the level shifted versions of the two complementary logic levels during a transition from a first to a second of the two complementary logic levels so as to eliminate a timing variance between the two complementary logic levels and the level shifted versions thereof.

22. The method according to claim 21, further comprising holding and outputting the level shifted versions of the two complementary logic levels on two output nodes after a transition from a first to a second of the two complementary logic levels.

23. The method according to claim 21, wherein the holding includes latching the level shifted versions of the two complementary logic levels after the transition.

24. A method for level shifting comprising:
a step for receiving a differential logic signal including two complementary logic levels associated therewith;
a step for level shifting the differential logic signal to form level shifted versions of the two complementary logic levels; and
a step for balancing the respective rise and fall times of the level shifted versions of the two complementary logic levels during a transition from a first to a second of the two complementary logic levels so as to eliminate a timing variance between the two complementary logic levels and the level shifted versions thereof.

25. The method according to claim 24, further comprising a step for holding and outputting the level shifted versions of the two complementary logic levels on two output nodes after a transition from a first to a second of the two complementary logic levels.

26. The method according to claim 25, wherein the step for holding includes a step for latching the level shifted versions of the two complementary logic levels after the transition.

27. A level shifter circuit comprising:
a first input circuit having an input and an output, wherein the first input circuit comprises:
a first transistor coupled between the input and the output having a gate coupled to a supply voltage;
a first capacitor coupled between the input and the output and in parallel to the first transistor; and
a second transistor coupled between the supply voltage and the output having a gate coupled to the input;
a second input circuit having an input and an output, wherein the second input circuit comprises:
a third transistor coupled between the input and the output having a gate coupled to a supply voltage;
a second capacitor coupled between the input and the output and in parallel to the third transistor; and
a fourth transistor coupled between the supply voltage and the output having a gate coupled to the input; and
a latch circuit coupled to the output of the first input circuit and to the output of the second input circuit.

28. The level shifter circuit of claim 27, wherein the first input circuit and the second input circuit are coupled to complementary input signals.

* * * * *